(12) United States Patent
Nakamura

(10) Patent No.: US 7,359,238 B2
(45) Date of Patent: Apr. 15, 2008

(54) SEMICONDUCTOR NONVOLATILE STORAGE CIRCUIT

(75) Inventor: Kazuyuki Nakamura, Fukuoka (JP)

(73) Assignee: Kitakyushu Foundation for the Advancement of Industry, Science and Technology, Kitakyushu-shi, Fukuoka (JP)

( * ) Notice: Subject to any disclaimer, the term of this patent is extended or adjusted under 35 U.S.C. 154(b) by 0 days.

(21) Appl. No.: 10/594,220

(22) PCT Filed: Mar. 30, 2005

(86) PCT No.: PCT/JP2005/006121

§ 371 (c)(1),
(2), (4) Date: Sep. 26, 2006

(87) PCT Pub. No.: WO2005/096314

PCT Pub. Date: Oct. 13, 2005

(65) Prior Publication Data

US 2007/0274127 A1    Nov. 29, 2007

(30) Foreign Application Priority Data

Mar. 31, 2004  (JP)  ............................. 2004-108484

(51) Int. Cl.
*G11C 11/34*  (2006.01)

(52) U.S. Cl. ............. 365/174; 365/189.05; 365/230.08

(58) Field of Classification Search ................ 365/174, 365/189.05, 230.08
See application file for complete search history.

(56) References Cited

U.S. PATENT DOCUMENTS 7,151,682 B2 * 12/2006 Haid et al. .................... 365/49
7,248,507 B2 *  7/2007 Nakamura ............. 365/189.05

FOREIGN PATENT DOCUMENTS

| JP | 4-82093 | 3/1992 |
|----|---------|--------|
| JP | 7-226088 | 8/1995 |
| WO | WO 95/22144 | 8/1995 |
| WO | WO 2004/057621 | 7/2004 |

* cited by examiner

*Primary Examiner*—Connie C. Yoha
(74) *Attorney, Agent, or Firm*—Edwards Angell Palmer & Dodge LLP

(57) ABSTRACT

A semiconductor nonvolatile storage circuit capable of stably storing and holding information by preventing pseudo-writing in storing/holding FETs is realized. The semiconductor nonvolatile circuit includes a first FET MNM1 forming a source-drain path between a ground potential GND and a bit line BL; a second FET MNM2 forming a source-drain path between the ground potential GND and a differential pair line BL_; a third FET MNM3 to open/close the connection between a drain terminal of the first FET MNM1 and the bit line BL; and a fourth FET MNM4 to open/close the connection between a drain terminal of the second FET MNM2 and the differential pair line BL_.

11 Claims, 12 Drawing Sheets

SEMICONDUCTOR NONVOLATILE STORAGE CIRCUIT

TECHNICAL FIELD

The present invention relates to a semiconductor nonvolatile storage circuit capable of keeping on holding data stored therein even after the power has been turned off.

BACKGROUND ART

Semiconductor nonvolatile storage circuits are semiconductor storage circuits that keep on holding data stored therein even after the power has been turned off. Examples of the semiconductor nonvolatile storage circuits include a flash EEPROM (electrically erasable programmable read only memory) using a floating gate structure, an FeRAM (ferroelectric random access memory) using a ferroelectric film, and an MRAM (magnetic random access memory) using a ferromagnetic film. These semiconductor nonvolatile storage circuits are expensive because they have a special transistor structure and are made of special material. These circumstances are causing demand for less expensive semiconductor nonvolatile storage circuits.

For example, Patent Document 1 suggests the following semiconductor nonvolatile storage circuit (hereinafter referred to as a known circuit). The known circuit includes two MISFETs (metal insulator semiconductor field-effect transistors). Source terminals of the two MISFETs connect to a ground potential, whereas gate terminals thereof connect to a word line. A drain terminal of the first MISFET connects to a bit line, whereas a drain terminal of the second MISFET connects to a differential pair line of the bit line.

In this known circuit, conduction resistance of the FETs is changed by applying an intermediate voltage between a power supply potential of the gate terminal of one of the two MISFETs and the ground potential, and "0" or "1" is stored in accordance with a high or low conduction resistance of the two MISFETs.

FIG. 7 is a circuit diagram showing the known circuit. This circuit includes first and second MISFETs MNM1 and MNM2 of the same type. Source terminals of the MISFETs connect to a ground potential GND through a common line COMM, and gate terminals thereof connect to a word line WL. A drain terminal of the first MISFET MNM1 connects to a bit line BL, and a drain terminal of the second MISFET MNM2 connects to a differential pair line BL_ of the bit line BL. A state where a threshold voltage Vt (MNM1) of the first MISFET MNM1 is higher than a threshold voltage Vt (MNM2) of the second MISFET MNM2 is a "0" storage state, and the opposite state is a "1" storage state.

The "type" means a distinction between n-channel-type and p-channel-type, and "the MISFETs of the same type" means that the "type" of those MISFETs is n-channel-type or p-channel-type (this is the same for the description below). Herein, the first and second MISFETs MNM1 and MNM2 are n-type MISFETs.

FIG. 8 is a timing chart showing a writing procedure in the known circuit. Writing in the known circuit is performed in the following manner. First, a state where the voltage of the word line WL is 2.5 V: about half of a power supply voltage (VDD), where the voltage of the bit line BL is 5 V: the same as the power supply voltage (VDD), and where the voltage of the differential pair line BL_ is 0 V (GND), is maintained for a predetermined period. Accordingly, only the first MISFET MNM1 operates in a saturation region, so that hot carriers are generated in the first MISFET MNM1 and the conduction resistance thereof increases. As a result, the threshold voltage Vt (MNM1) of the first MISFET MNM1 rises to become higher than the threshold voltage Vt (MNM2) of the second MISFET MNM2, and the "0" storage state occurs. On the other hand, if a state where the voltage of the bit line BL is 0 V (GND), where the voltage of the differential pair line BL_ is 5 V (VDD), and where the voltage of the word line WL is 2.5 V, is maintained for a predetermined period, the conduction resistance of the second MISFET MNM2 increases and the threshold voltage Vt (MNM2) of the second MISFET MNM2 rises. As a result, the threshold voltage Vt (MNM1) of the first MISFET MNM1 becomes lower than the threshold voltage Vt (MNM2) of the second MISFET MNM2, and the "1" storage state occurs. The amount of shift in the threshold voltage Vt may have at least a level distinguishable by the ability of a reading circuit.

FIG. 9 is an illustration of a principle of overwriting in the known circuit. The left vertical axis indicates the threshold voltage Vt (MNM1) of the first MISFET MNM1, and the right vertical axis indicates the threshold voltage Vt (MNM2) of the second MISFET MNM2. In an initial stage (before writing), the threshold voltage Vt (MNM1) and the threshold voltage Vt (MNM2) are equal to each other at Vt0. As described above, when the first MISFET MNM1 is operated in the saturation region, the threshold voltage Vt (MNM1) shifts to Vt1, which is higher than the threshold voltage Vt (MNM2) (=Vt0) of the second MISFET MNM2. Accordingly, the "0" storage state occurs. Then, the second MISFET MNM2 is allowed to operate in the saturation region so that the threshold voltage Vt (MNM2) shifts to Vt2, which is higher than Vt1. Accordingly, the "0" storage state changes to the "1" storage state. Again, the first MISFET MNM1 is allowed to operate in the saturation region so that the threshold voltage Vt (MNM1) shifts from Vt1 to Vt3. Accordingly, the "1" storage state changes to the "0" storage state. In this way, every time the MISFET of the lower threshold voltage is allowed to operate in the saturation region and the threshold voltage thereof shifts to a level higher than that of the threshold voltage of the other MISFET, the "0" storage state and the "1" storage state are switched therebetween (note that, the switching is impossible after the conduction resistance has increased and the threshold voltage does not shift any more). Since change in the threshold voltage depends on change of elements, the "0" or "1" storage state is maintained even after the power is turned off.

FIG. 10 is a timing chart illustrating a reading operation in the known circuit. Reading in the known circuit is performed in the following manner. First, the voltage of the bit line BL is set to the power supply voltage (VDD) in advance. Then, the voltage of the word line WL is raised to the power supply voltage (VDD), the first and second MISFETs MNM1 and MNM2 are brought into conduction at the same time, a difference between the threshold voltages of the MISFETs is read as a difference between the voltage of the bit line BL and the voltage of the differential pair line BL_, and then "0" or "1" is determined.

When information of a plurality of bits is to be written or read by arranging a plurality of known circuits, the following configuration is applied. FIG. 11 shows an example of a storage circuit including a plurality of known circuits. This storage circuit includes four known circuits arranged in two rows and two columns, so that information of four bits can be written/read. In this circuit, two word lines WL0 and WL1 and two pairs of bit lines BL0 and BL0_ and BL1 and BL1_ are shared by the two known circuits arranged in the row direction and the column direction, respectively.

Alternatively, a volatile storage circuit may be combined with the known circuit. In that case, information stored in the known circuit is written in the volatile storage circuit when the power is turned on, information is read or rewritten from/in the volatile storage circuit while the power is on, and the information stored in the volatile circuit is written in the known circuit before turning off the power.

FIG. 12 shows a combination of the volatile storage circuit and the known circuit. In this example, the known circuit SC connects to storage nodes C and C_ of the static semiconductor memory SM.

The static semiconductor memory SM is a known static semiconductor memory (SRAM: static random access memory). A flip-flop is constituted by cross connection of a first inverter circuit including an n-type driving transistor MN1 and a p-type load transistor MP1 and a second inverter circuit including an n-type driving transistor MN2 and a p-type load transistor MP2, and data of "1" or "0" is stored in the storage nodes C and C_.

The storage nodes C and C_ connect to a pair of bit lines BL and BL_ via transfer transistors MNT1 and MNT2, respectively. Gate terminals of the transfer transistors MNT1 and MNT2 connect to a word line WL. The paths between the storage nodes C and C_ and the pair of bit lines BL and BL_ are electrically opened/closed by a signal of the word line WL.

The known circuit SC includes the first MISFET MNM1 forming a source-drain path between the storage node C of the static semiconductor memory SM and a ground potential (GND) and the second MISFET MNM2 forming a source-drain path between the storage node C_ and the ground potential (GND). Gate terminals of the first and second MISFETs MNM1 and MNM2 connect to a word line WLW.

A transistor MPEQ is a switching element to open/close the connection between the storage nodes C and C_ by using a signal line EQ. A transistor MNRS is a switching element to open/close the connection between the driving transistors MN1 and MN2 and the ground potential GND by using a signal line RESTORE.

With this configuration, the storage circuit shown in FIG. 12 functions as a static semiconductor memory (SRAM) if a RESTORE signal is at a power supply potential, if a WLW signal is at a ground potential, and if an EQ signal is at the power supply potential. On the other hand, the storage circuit shown in FIG. 12 functions as a semiconductor nonvolatile storage circuit equivalent to the known circuit shown in FIG. 7 if the RESTORE signal is at the ground potential, if the WLW signal is at the power supply potential, and if the EQ signal is at the ground potential.

Patent Document 1: International Publication No. WO2004/057621

DISCLOSURE OF THE INVENTION

Problems to be Solved by the Invention

The known circuit stores information by using an increase in conduction resistance between the source and drain of the MISFET caused by generated hot carriers, and is thus excellent in a capability of holding information without being applied with a power supply voltage. However, when the plurality of known circuits are used by arranging them, unintended hot carriers are disadvantageously generated in the MISFET (=an increase in conduction resistance=rewrite of stored information).

For example, in the circuit shown in FIG. 11, assume a case where a writing operation is performed on a first MISFET MN001 by raising the voltages of the word line WL0 and the bit line BL0. Since the bit line BL0 also connects to a first MISFET MN011, a voltage same as that of the source of the first MISFET MN001 is applied to the source terminal of the first MISFET MN011 even if the word line WL1 is not selected (that is, the voltage of WL1=ground potential GND). If this state continues for a long time, unintended hot carriers are generated also in the first MISFET MN011 in an unselected state. Accordingly, so-called pseudo-writing may occur and the information that should be stored may be lost.

The present invention has been made in view of these problems and is directed to realizing a semiconductor nonvolatile storage circuit capable of stably storing and holding information by preventing pseudo-writing in storing/holding MISFETs.

Means for Solving the Problems

According to a first configuration of the semiconductor nonvolatile storage circuit according to the present invention, the semiconductor nonvolatile storage circuit includes first and second MISFETs, source terminals of the first and second MISFETs connecting to a ground potential, gate terminals of the first and second MISFETs connecting to a first word line, a drain terminal of the first MISFET connecting to a bit line, and a drain terminal of the second MISFET connecting to a differential pair line of the bit line. The semiconductor nonvolatile storage circuit includes a first switching element to electrically open/close a path between the drain terminal of the first MISFET and the bit line; and a second switching element to electrically open/close a path between the drain terminal of the second MISFET and the differential pair line.

With this configuration, the drain terminals of the first and second MISFETs can be set to an open (floating) state when the semiconductor nonvolatile storage circuit is not selected, and thus it can be prevented that an unintended drain current flows to the first and second MISFETs.

According to a second configuration of the semiconductor nonvolatile storage circuit according to the present invention, in the first configuration, the first and second switching elements are third and fourth MISFETs, and gate terminals of the third and fourth MISFETs connect to a second word line.

With this configuration, the first and second switching elements are FETs of the same type as that of the first and second MISFETs, so that the circuit can be easily formed.

According to a third configuration of the semiconductor nonvolatile storage circuit according to the present invention, in the first or second configuration, the drain terminals of the first and second MISFETs connect to the ground potential via third and fourth switching elements, respectively.

With this configuration, the potentials of the drain terminals of the first and second MISFETs can be the same as the potentials of the source terminals when the semiconductor nonvolatile storage circuit is not selected, and thus there is no possibility that a drain current flows to the first and second MISFETs.

According to a fourth configuration of the semiconductor nonvolatile storage circuit according to the present invention, in the third configuration, the third and fourth switching elements are fifth and sixth MISFETs, and gate terminals of the fifth and sixth MISFETs connect to a differential pair line of the second word line.

With this configuration, the third and fourth switching elements are FETs of the same type as that of the first to fourth MISFETs, so that the circuit can be easily formed.

According to a fifth configuration of the semiconductor nonvolatile storage circuit according to the present invention, in any of the second to fourth configurations, the semiconductor nonvolatile storage circuit further includes a volatile storage circuit whose one storage node connects to the bit line and the other storage node connects to the differential pair line of the bit line. A drain terminal of the third MISFET connects to the one storage node of the volatile storage circuit, a drain terminal of the fourth MISFET connects to the other storage node of the volatile storage circuit, the one storage node and the other storage node of the volatile storage circuit connect to each other via a fifth switching element, and a ground line of the volatile storage circuit connects to the ground potential via a sixth switching element.

With this configuration, the semiconductor nonvolatile storage circuit and the volatile storage circuit can be alternately used by switching therebetween by using the fifth and sixth switching elements, and thus the frequency of overwriting in the semiconductor nonvolatile storage circuit can be reduced. Accordingly, the life of the semiconductor nonvolatile storage circuit can be extended.

According to a sixth configuration of the semiconductor nonvolatile storage circuit according to the present invention, in any of the first to fifth configurations, a conduction resistance value of the first or second MISFET is changed so that conduction resistance values of the first and second MISFETs differ from each other by applying an intermediate voltage between a power supply potential and a ground potential to the first word line and by applying the power supply potential to any one of the bit line and the differential pair line of the bit line, whereby "1" or "0" is stored in accordance with the difference between the conduction resistance values.

With this configuration, storage is performed in accordance with the difference between the conduction resistance values of the first and second MISFETs, and thus the stored data is held even after the power has been turned off.

Advantages

With the above-described configuration of the present invention, flow of an unintended drain current to a storing/holding MISFET can be prevented and pseudo-writing can be prevented when the semiconductor nonvolatile storage circuit is not selected, and thus a semiconductor nonvolatile storage circuit capable of stably storing and holding data can be realized. Also, the semiconductor nonvolatile storage circuit of the present invention is configured by a combination of FETs and does not require other elements. Therefore, the circuit can be easily designed and manufactured, the development period can be shortened, and the manufacturing cost can be reduced advantageously. Furthermore, the life of the semiconductor nonvolatile storage circuit can be extended by using it in combination with a volatile storage circuit.

REFERENCE NUMERALS

BL, BL0, and BL1: bit line
BL_, BL0_, and BL1_: differential pair line (of bit line)
C and C_: storage node
COMM, COMM0, and COMM1: common line
MN111, MNM1, MN001, MN011, and MN101: first MISFET
MN112, MNM2, MN002, MN012, and MN102: second MISFET
MN113, MNM3, MN003, MN013, and MN103: third MISFET
MN114, MNM4, MN004, MN014, and MN104: fourth MISFET
MNM5: fifth MISFET
MNM6: sixth MISFET
MN1 and MN2: driving transistor
MP1 and MP2: load transistor
MNT1 and MNT2: transfer transistor
MPEQ and MNRS: transistor
SC: known circuit
SI: semiconductor nonvolatile storage circuit
SM: static semiconductor memory
WLWS, WL, WL0, WL1, WLS, WLS0, WLS1, and WLW: word line
WL_ and WLS_: differential pair line (of word line)

BEST MODE FOR CARRYING OUT THE INVENTION

Hereinafter, the best mode for carrying out the invention is described with reference to the drawings.

First Embodiment

Figure 1:
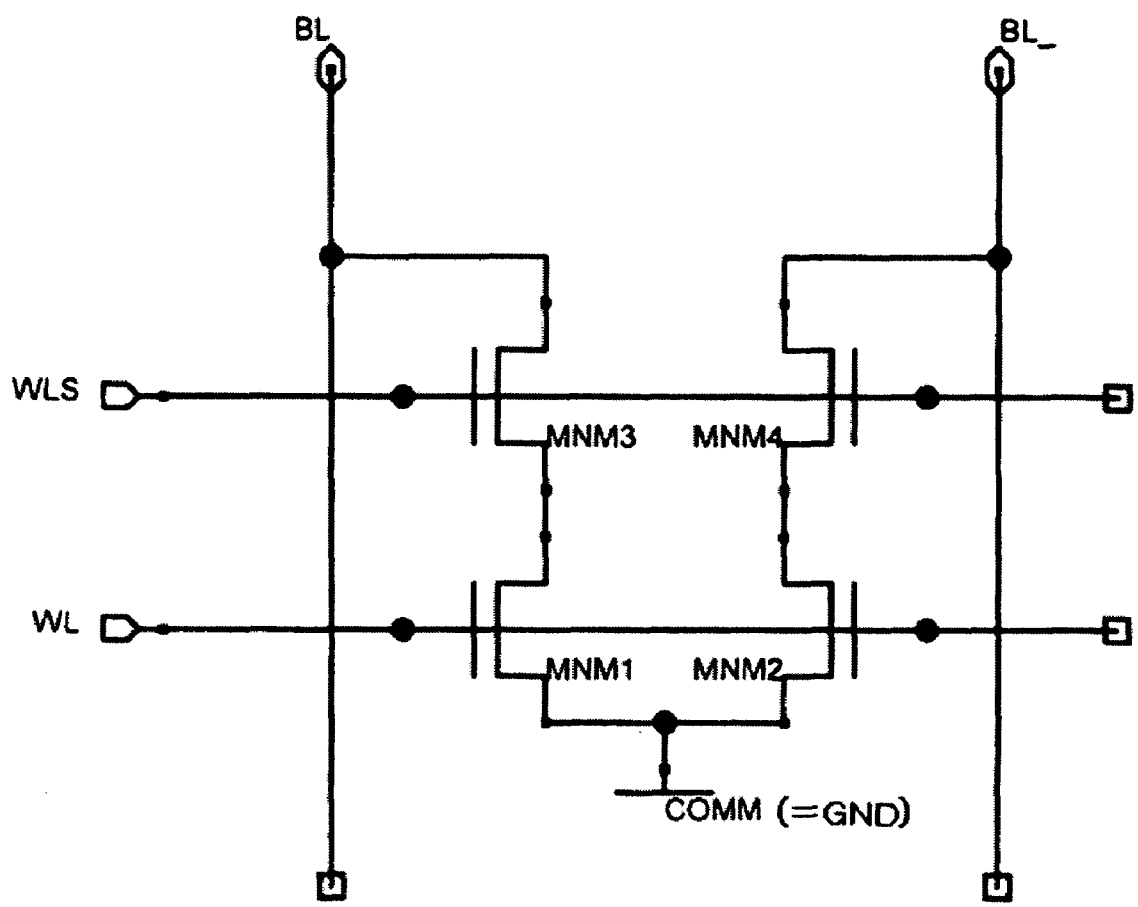
FIG. 1 is a circuit diagram showing a semiconductor nonvolatile storage circuit according to a first embodiment of the present invention.
Figure 7:
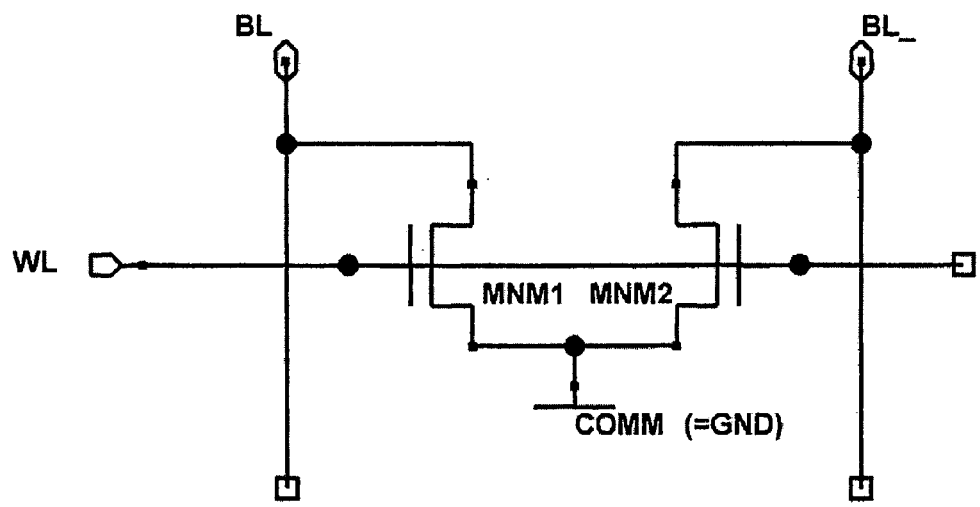
FIG. 7 is a circuit diagram showing an example of a known circuit.
Figure 8:
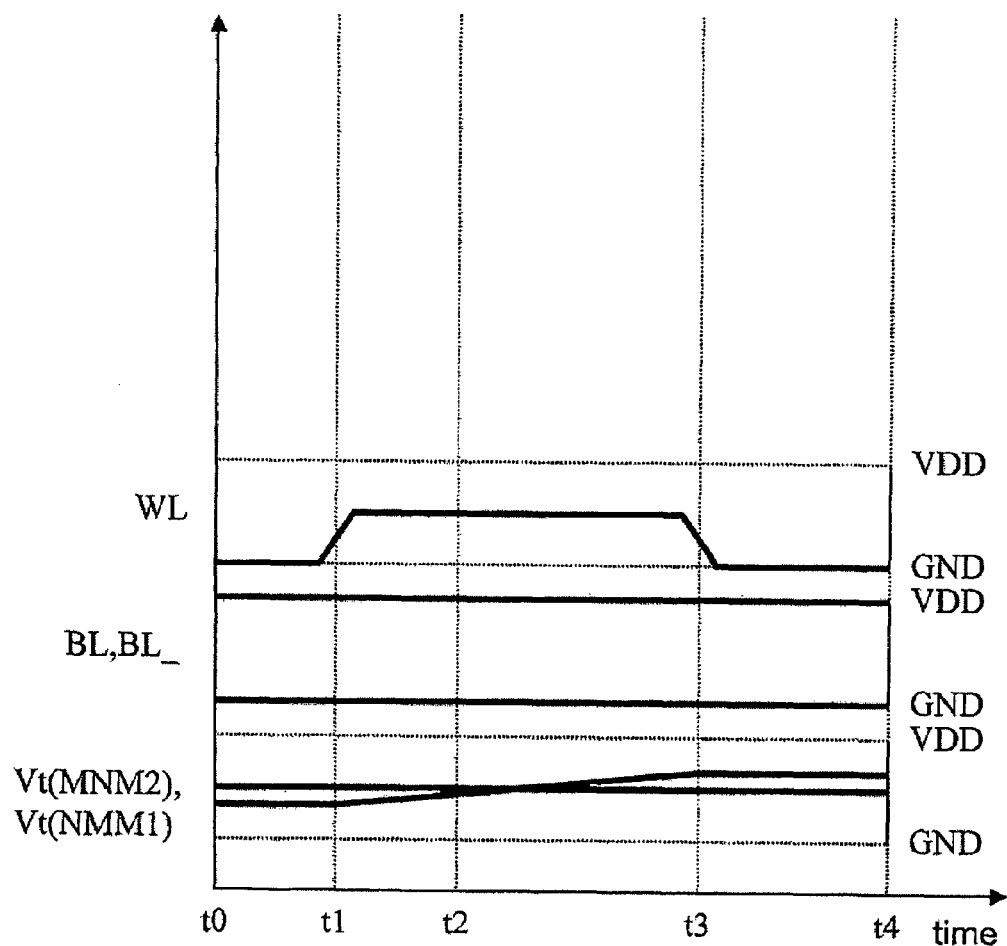
FIG. 8 is a timing chart illustrating a writing operation in the known circuit shown in FIG. 7.
Figure 9:
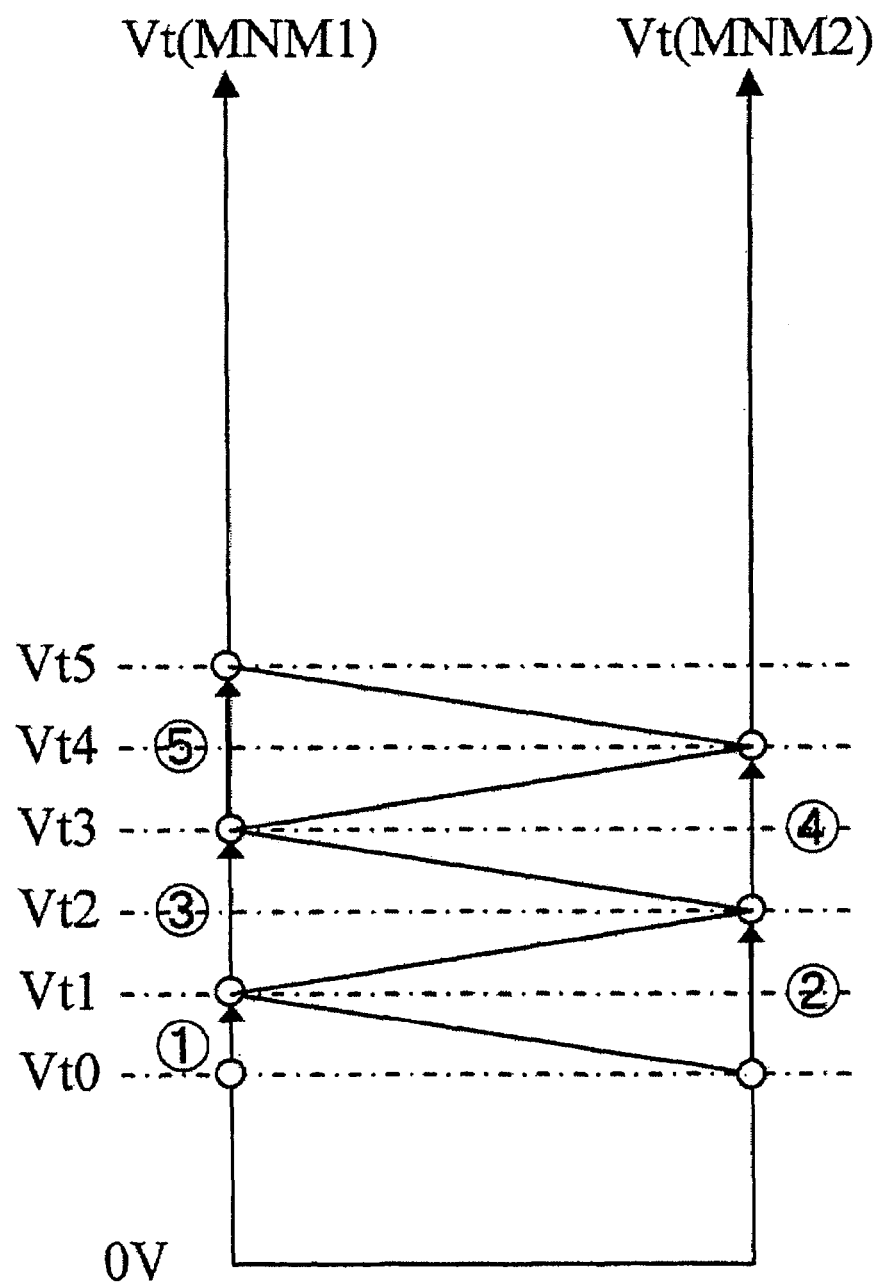
FIG. 9 is a timing chart illustrating a reading operation in the known circuit shown in FIG. 7.
Figure 10:
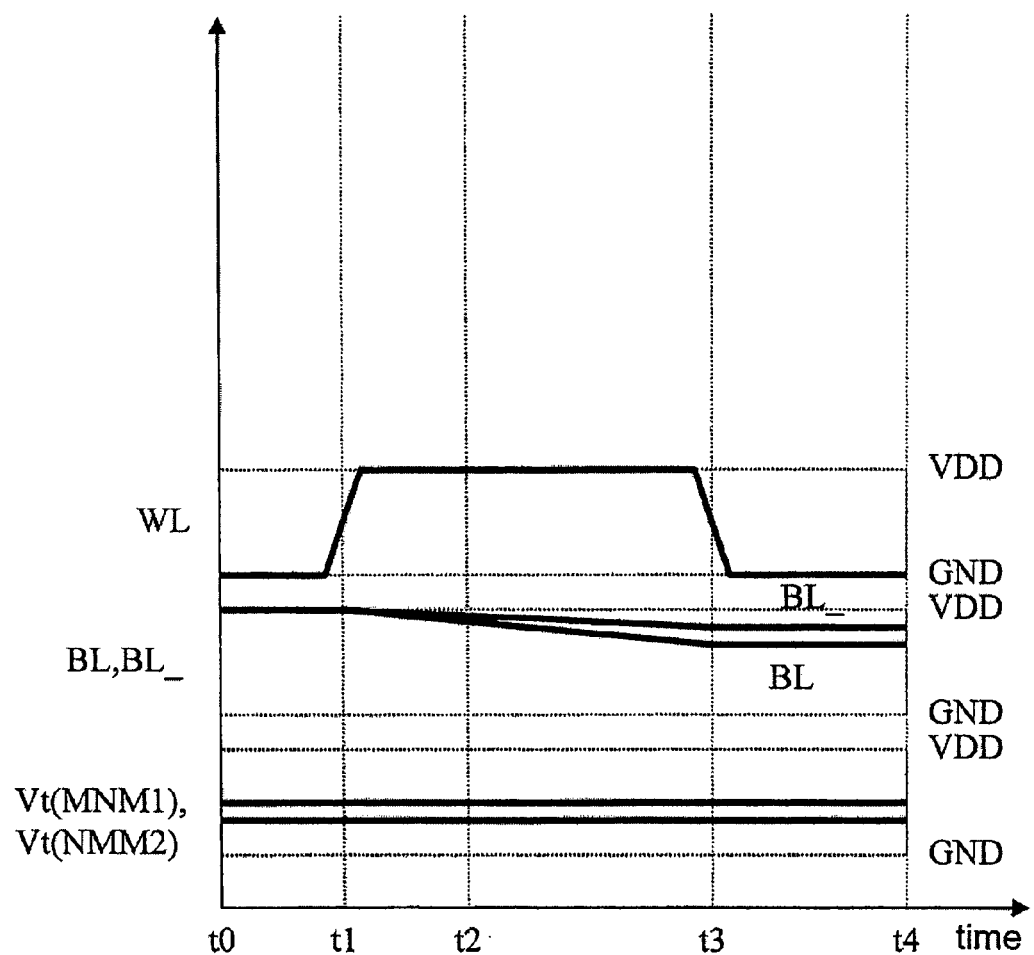
FIG. 10 is an illustration of an overwriting method performed in the known circuit shown in FIG. 7.
Figure 11:
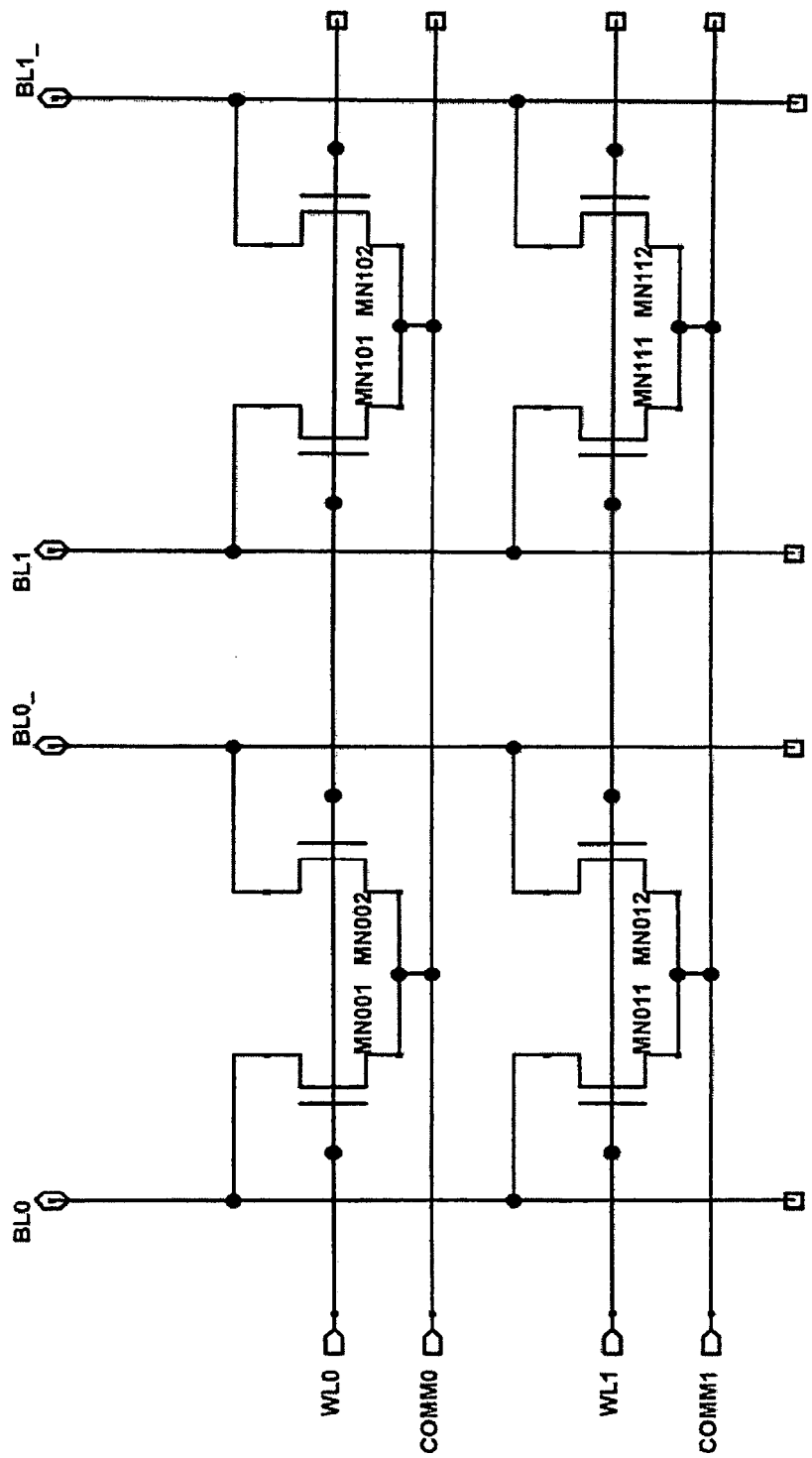
FIG. 11 is a circuit diagram showing a storage circuit including a plurality of known circuits.

FIG. 1 is a circuit diagram showing a semiconductor nonvolatile storage circuit according to a first embodiment of the present invention. This semiconductor nonvolatile storage circuit is characterized in including a third MISFET MNM3 and a fourth MISFET MNM4 in addition to the components of the known circuit shown in FIG. 7. The third and fourth MISFETs MNM3 and MNM4 have a structure and a layout that are less likely to cause deterioration of elements due to generated hot carriers or the like, compared to the first and second MISFETs MNM1 and MNM2. For example, a large gate width can reduce the amount of hot carriers to be generated, so that deterioration of the elements is less likely to occur. The elements common to those of the known circuit are denoted by the same reference numerals, and the corresponding description is omitted.

The third MISFET MNM3 forms a source-drain path between the drain terminal of the first MISFET MNM1 and the bit line BL, and the fourth MISFET MNM4 forms a source-drain path between the drain terminal of the second MISFET MNM2 and the differential pair line BL_. Gate terminals of the third and fourth MISFETs MNM3 and MNM4 connect to a word line WLS. The third and fourth MISFETs MNM3 and MNM4 are n-type MISFETs.

Figure 2:
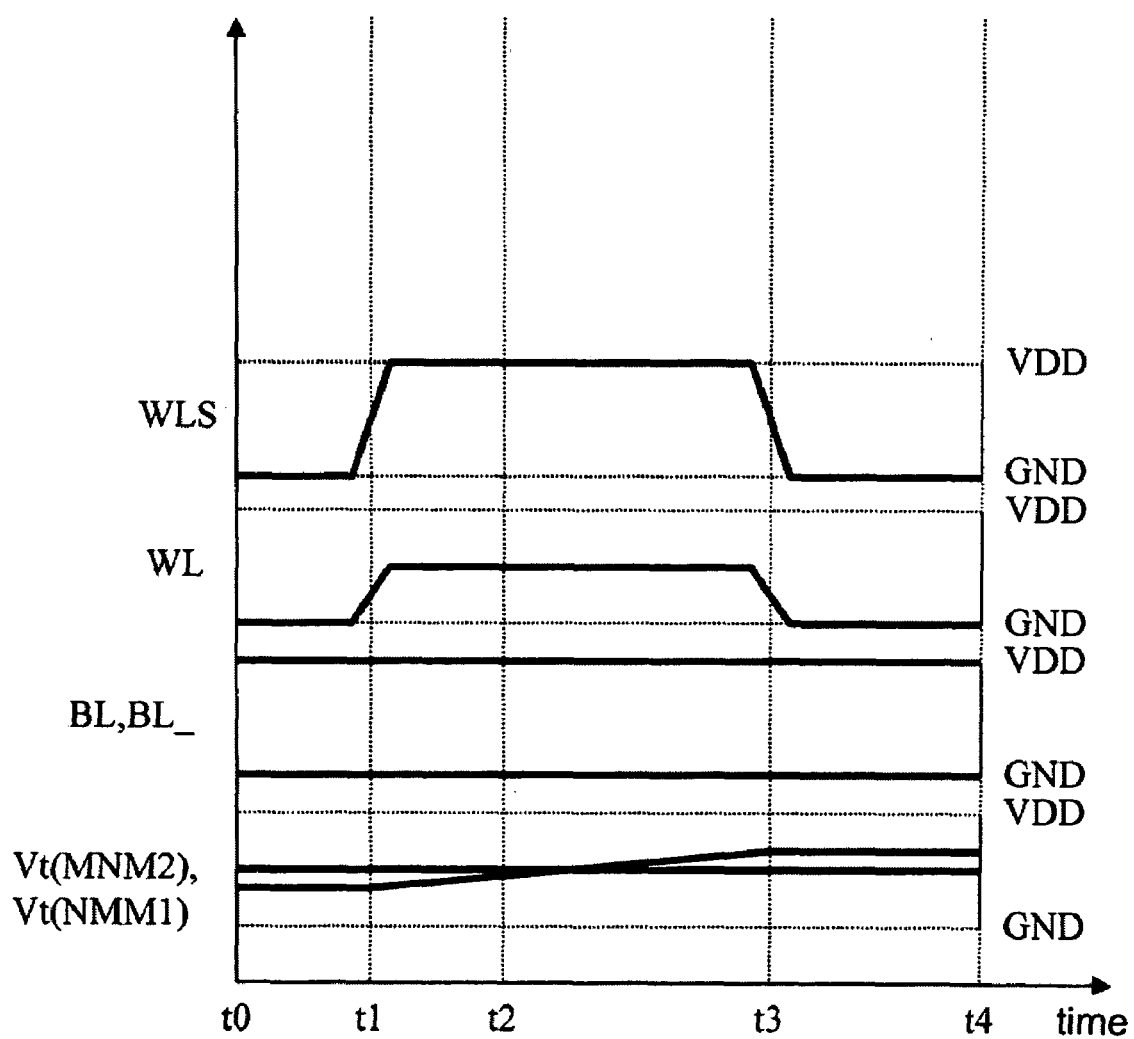
FIG. 2 is a timing chart illustrating a writing operation in the semiconductor nonvolatile storage circuit shown in FIG. 1.
Figure 3:
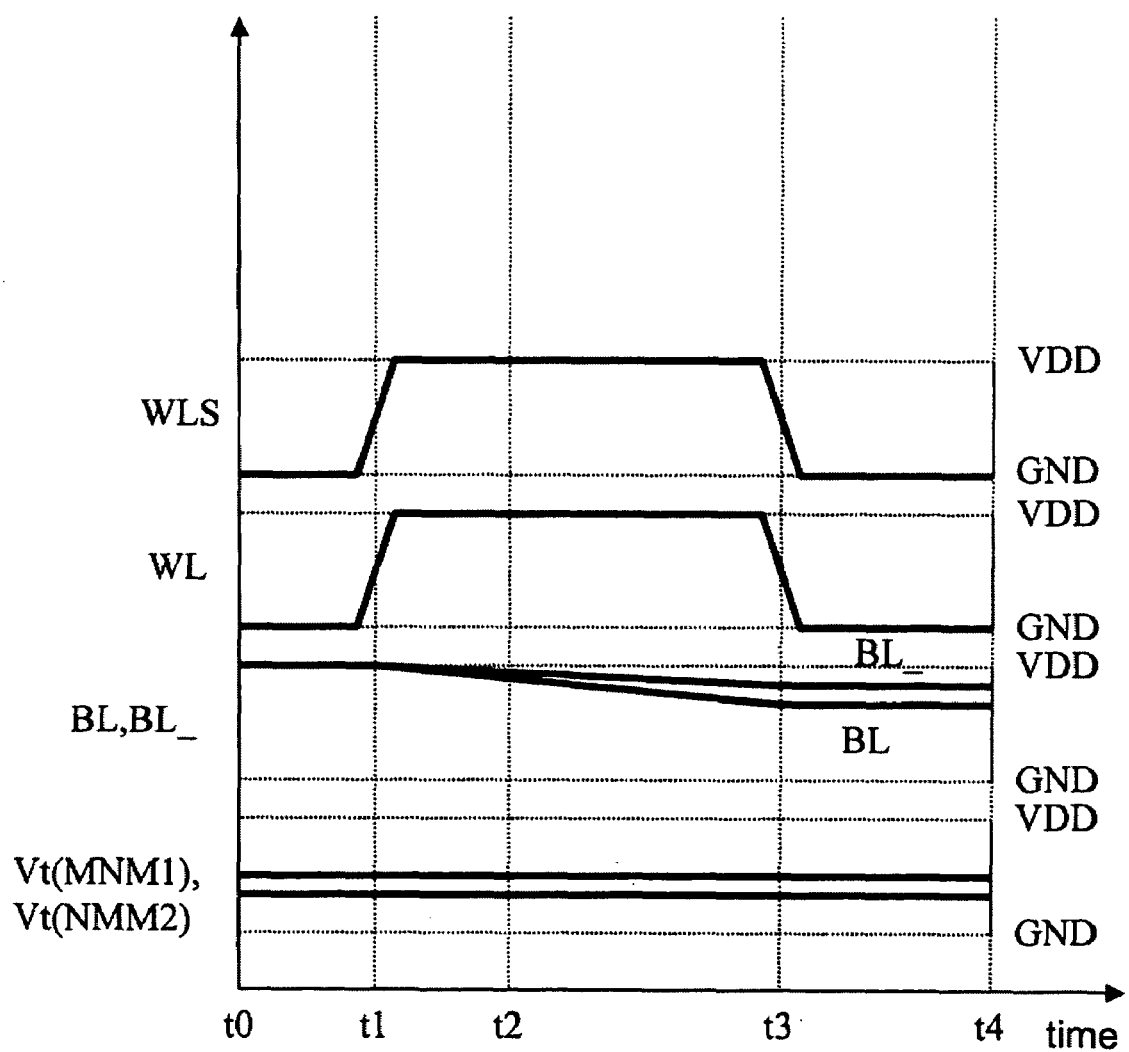
FIG. 3 is a timing chart illustrating a reading operation in the semiconductor nonvolatile storage circuit shown in FIG. 1.

FIG. 2 is a timing chart illustrating a writing operation in the semiconductor nonvolatile storage circuit shown in FIG. 1, and FIG. 3 is a timing chart illustrating a reading operation. As shown in FIGS. 2 and 3, when the semiconductor nonvolatile storage circuit is selected to write or read data, the voltage of the word line WLS rises to a power supply potential (VDD) in synchronization with the voltage of the word line WL. When the semiconductor nonvolatile storage circuit is not selected, the voltages of the word lines WLS and WL are kept at a ground potential (GND). Therefore, when the semiconductor nonvolatile storage circuit is not selected, the drain terminals of the first and second MISFETs MNM1 and MNM2 are open (floating), and thus no voltage is applied from the pair of bit lines BL and BL_ to the first and second MISFETs MNM1 and MNM2.

Second Embodiment

Figure 4:
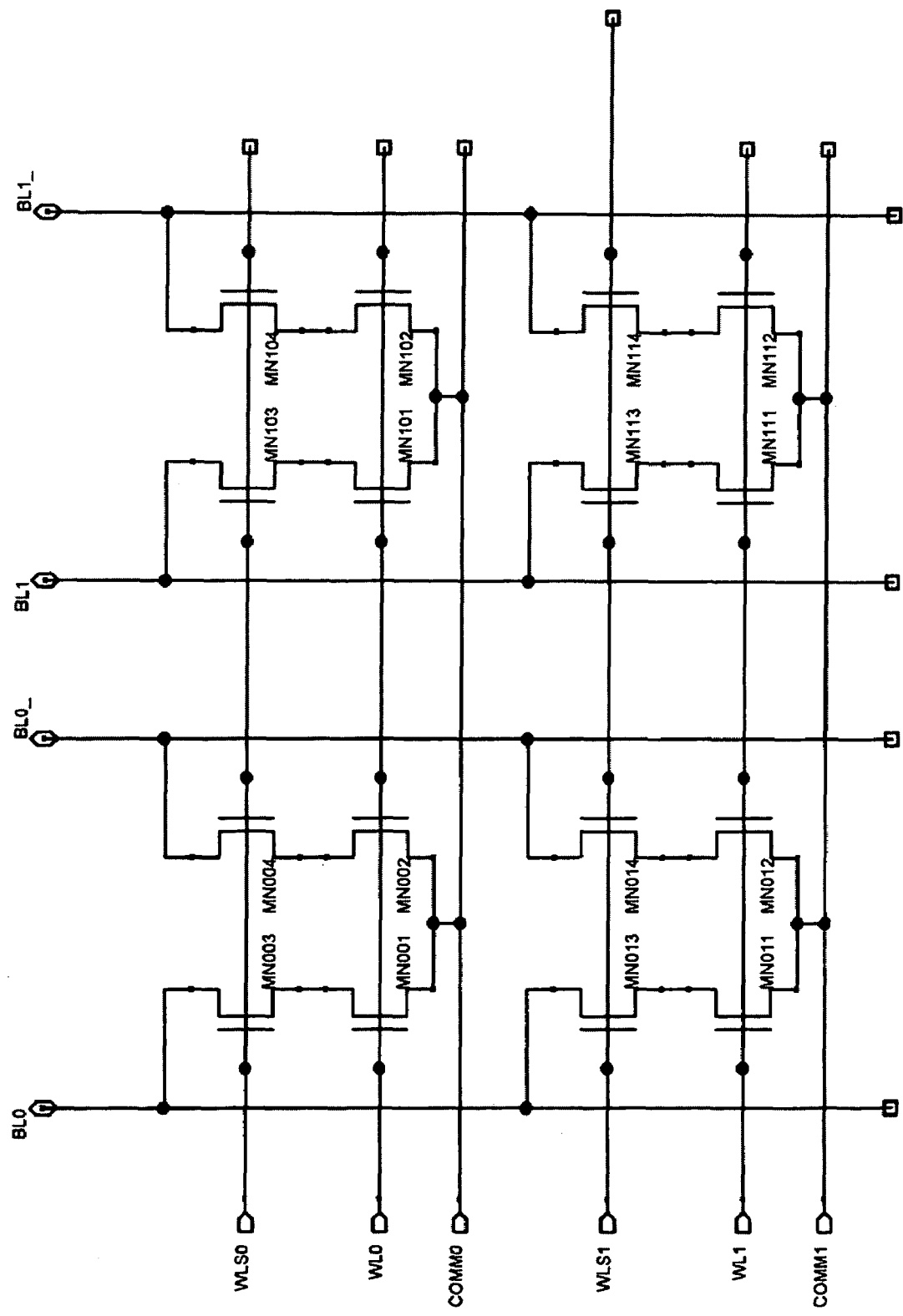
FIG. 4 is a circuit diagram showing a storage circuit according to a second embodiment of the present invention.

FIG. 4 is a circuit diagram of a storage circuit according to a second embodiment of the present invention. This storage circuit includes two rows×two columns of semiconductor nonvolatile storage circuits, each being the circuit shown in FIG. 1, so that four bits of information can be written/read. In this circuit, four word lines WL0, WL1, WLS0, and WLS1; and two pairs of bit lines BL0 and BL0_ and BL1 and BL1_ are shared by the two semiconductor nonvolatile storage circuits arranged in the row direction and the column direction, respectively. Two common lines COMM0 and COMM1 are shared by the two semiconductor nonvolatile storage circuits arranged in the row direction, but the four semiconductor nonvolatile storage circuits can be connected by one common line.

In this storage circuit, when the upper two semiconductor nonvolatile storage circuits are selected by raising the voltages of the word lines WL0 and WL1 to the power supply potential (VDD) in order to perform writing or reading, the lower two semiconductor nonvolatile storage circuits can be totally electrically disconnected from the pairs of bit lines BL0 and BL0_ and BL1 and BL1_ by setting the voltage of the word line WLS1 to the ground potential (GND). Accordingly, the lower two semiconductor nonvolatile storage circuits can be prevented from going into a pseudo-writing state.

Likewise, when the lower two semiconductor nonvolatile storage circuits are selected to perform writing or reading, the upper two semiconductor nonvolatile storage circuits can be totally electrically disconnected from the pairs of bit lines BL0 and BL0_ and BL1 and BL1_ by setting the voltage of the second word line WLS0 to the ground potential (GND). Accordingly, the upper two semiconductor nonvolatile storage circuits can be prevented from going into a pseudo-writing state.

Third Embodiment

Figure 5:
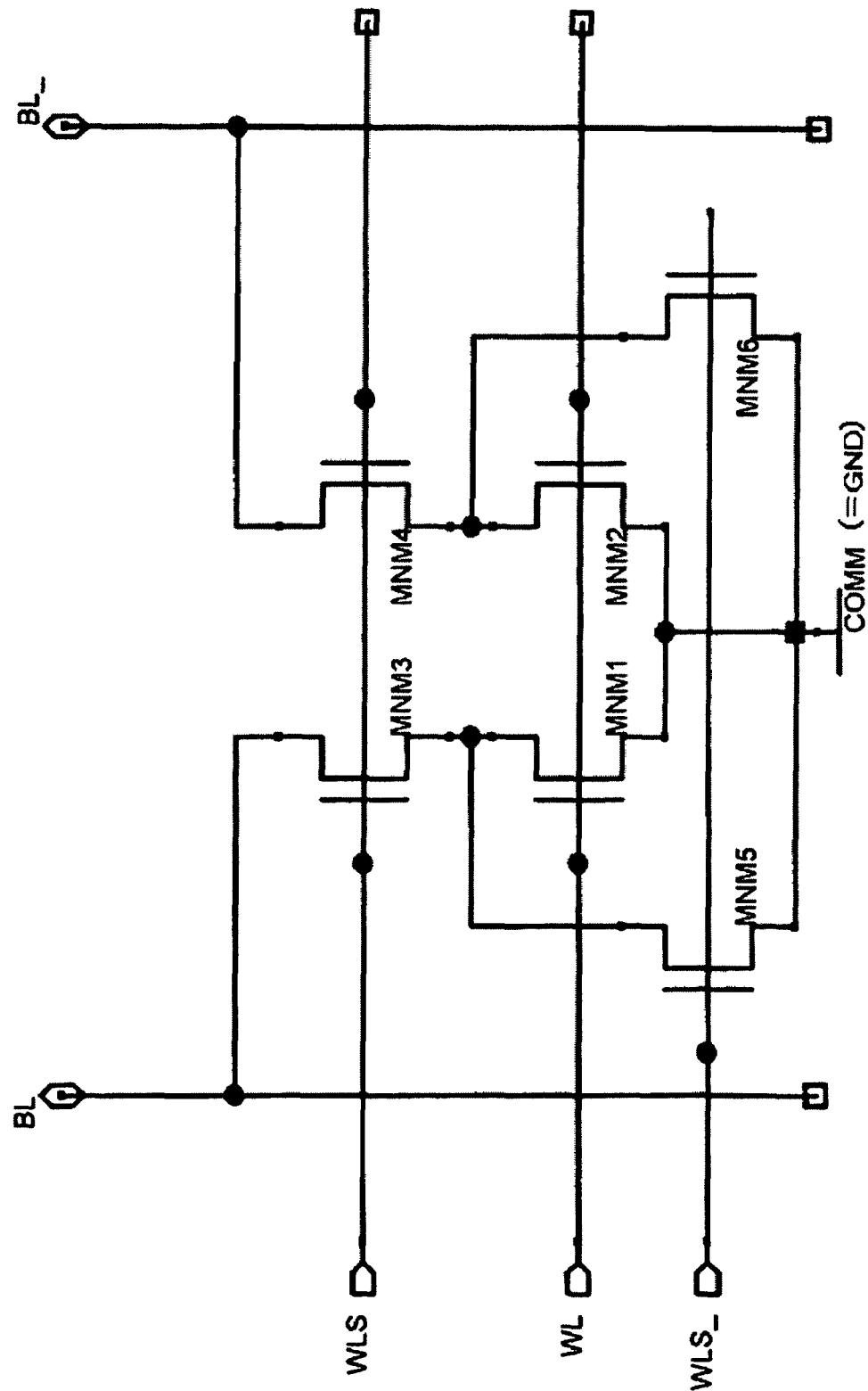
FIG. 5 is a circuit diagram showing a semiconductor nonvolatile storage circuit according to a third embodiment of the present invention.

FIG. 5 is a circuit diagram showing a semiconductor nonvolatile storage circuit according to a third embodiment of the present invention. This semiconductor nonvolatile storage circuit is characterized in including a fifth MISFET MNM5 and a sixth MISFET MNM6 in addition to the components of the semiconductor nonvolatile storage circuit shown in FIG. 1. A drain terminal of the fifth MISFET MNM5 connects to the drain terminal of the first MISFET MNM1, and a source terminal thereof connects to the common line COMM. A drain terminal of the sixth MISFET MNM6 connects to the drain terminal of the second MISFET MNM2, and a source terminal thereof connects to the common line COMM. Gate terminals of the fifth and sixth MISFETs MNM5 and MNM6 connect to a differential pair line WLS_ of the word line WLS and receive an inversion signal of a WLS signal input to the gate terminals of the third and fourth MISFETs MNM3 and MNM4. The fifth and sixth MISFETs MNM5 and MNM6 are n-type MISFETs. The elements common to those of the semiconductor nonvolatile storage circuit shown in FIG. 1 are denoted by the same reference numerals, and the corresponding description is omitted.

With this configuration, when this storage circuit is not selected, the potentials of the drain terminals of the first and second MISFETs MNM1 and MNM2 can be set at the same level as that of the source terminals. Thus, there is no possibility that a drain current flows to the first and second MISFETs MNM1 and MNM2. Accordingly, pseudo-writing under an unselected state can be prevented more reliably.

Fourth Embodiment

Figure 6:
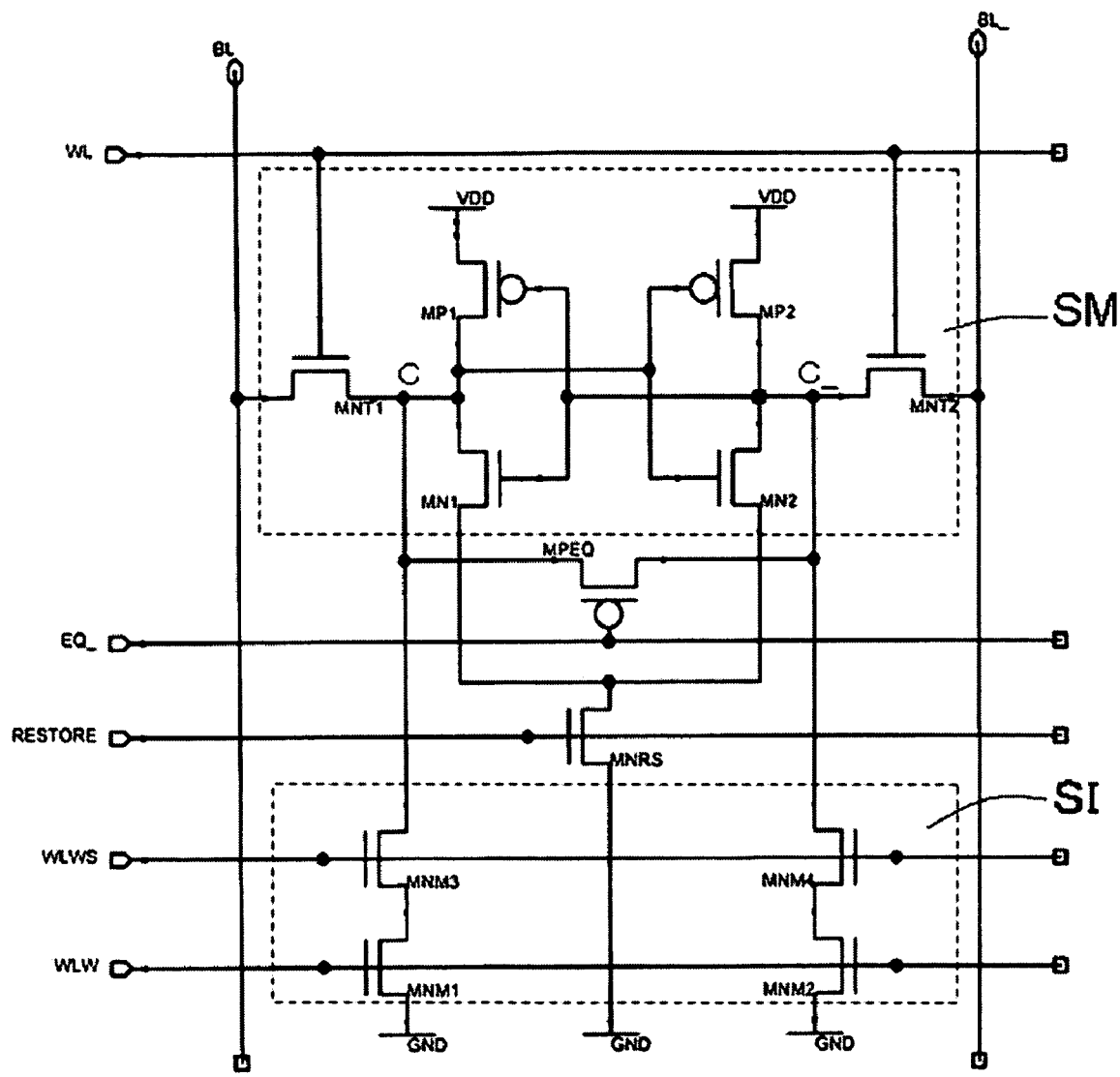
FIG. 6 is a circuit diagram showing a storage circuit according to a fourth embodiment of the present invention.
Figure 12:
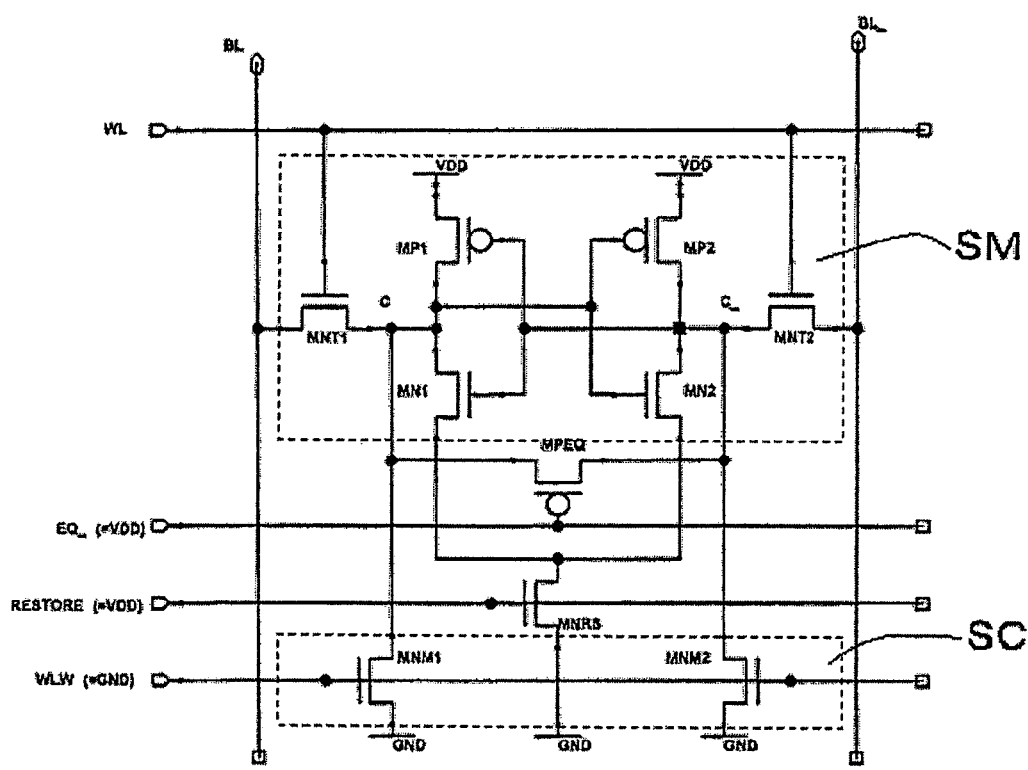
FIG. 12 is a circuit diagram showing another example of the known circuit.

FIG. 6 is a circuit diagram showing a storage circuit according to a fourth embodiment of the present invention. This storage circuit is formed by connecting the two storage nodes of the known static semiconductor memory SM to input and output terminals of a semiconductor nonvolatile storage circuit SI. The static semiconductor memory SM has the same configuration as that of the circuit shown in FIG. 12. The elements thereof are denoted by the same reference numerals and thus the corresponding description is omitted.

In the semiconductor nonvolatile storage circuit SI, as in the semiconductor nonvolatile storage circuit according to the first embodiment, the source terminals of the first and second MISFETs MNM1 and MNM2 connect to the ground potential GND, the gate terminals thereof connect to a word line WLW, the drain terminal of the first MISFET MNM1 connects to the source terminal of the third MISFET MNM3, the drain terminal of the third MISFET MNM3 connects to a storage node C of the static semiconductor memory SM, the drain terminal of the second MISFET MNM2 connects to the source terminal of the fourth MISFET MNM4, the drain terminal of the fourth MISFET MNM4 connects to a storage node C_ of the static semiconductor memory SM, and the gate terminals of the third and fourth MISFETs MNM3 and MNM4 connect to a word line WLWS. As in the first embodiment, a WLWS signal is risen or fallen in synchronization with a WLW signal.

With this configuration, this circuit functions as a static semiconductor memory if a RESTORE signal is set to the power supply potential, if a WLW signal is set to the ground potential GND, and if an EQ signal is set to the power supply potential VDD. On the other hand, this circuit functions as a circuit equivalent to the semiconductor nonvolatile storage circuit according to the first embodiment if the RESTORE signal is set to the ground potential GND, if the WLW signal is set to the power supply potential VDD, and if the EQ signal is set to the ground potential GND.

In this storage circuit, if normal reading and writing operations are performed in the static semiconductor memory SM and if data is written in the semiconductor nonvolatile storage circuit SI only at the timing before turning off the power, the frequency of overwriting data on the semiconductor nonvolatile storage circuit SI can be reduced, and thus the life of the semiconductor nonvolatile storage circuit SI can be extended. Furthermore, any voltage stress is not applied to the first and second MISFETs MNM1 and MNM2 while the static semiconductor memory SM is operating, and thus nonvolatile storage information can be stably held. While power is being applied, the static semiconductor memory SM that is excellent in reading and writing speed responds to read and write requests, so that a response speed during a normal operation increases.

In the above-described example, an increase in conduction resistance (rise of threshold voltage) of a FET caused by generation of hot carriers due to a drain current is used for nonvolatile storage. However, the semiconductor nonvolatile storage circuit according to the present invention is not limited to this example. Change of another characteristic or phenomenon that occurs due to a drain current flown to the FET can also be used.

In the above-described embodiments, circuits using n-type MISFETs are described. However, the semiconductor nonvolatile storage circuit according to the present invention is not limited to a circuit using the n-type MISFETs. For example, the semiconductor nonvolatile storage circuit of the present invention can be configured by using an element deterioration phenomenon due to hot holes of a p-type MISFET.

INDUSTRIAL APPLICABILITY

As described above, according to the present invention, a semiconductor nonvolatile storage circuit capable of stably storing/holding data can be provided in low cost. The present invention is applicable not only in semiconductor manufacturing industries to directly manufacture semiconductor nonvolatile storage circuits but also in many related industrial fields, such as manufacturing industries of various information apparatuses, industrial apparatuses, and consumer-oriented apparatuses using the semiconductor nonvolatile storage circuits.

The invention claimed is:

1. A semiconductor nonvolatile storage circuit including first and second MISFETs,
    source terminals of the first and second MISFETs connecting to a ground potential,
    gate terminals of the first and second MISFETs connecting to a first word line,
    a drain terminal of the first MISFET connecting to a bit line, and
    a drain terminal of the second MISFET connecting to a differential pair line of the bit line,
    the semiconductor nonvolatile storage circuit comprising:
    a first switching element to electrically open/close a path between the drain terminal of the first MISFET and the bit line;
    a second switching element to electrically open/close a path between the drain terminal of the second MISFET and the differential pair line and
    wherein a conduction resistance value of the first or second MISFET is changed so that conduction resistance values of the first and second MISFETs differ from each other by applying an intermediate voltage between a power supply potential and a ground potential to the first word line and by applying the power supply potential to any one of the bit line and the differential pair line of the bit line, whereby "1" or "0" is stored in accordance with the difference between the conduction resistance values.

2. The semiconductor nonvolatile storage circuit according to claim 1,
    wherein the first and second switching elements are third and fourth MISFETs, and
    wherein gate terminals of the third and fourth MISFETs connect to a second word line.

3. The semiconductor nonvolatile storage circuit according to claim 1,
    wherein the drain terminals of the first and second MISFETs connect to the ground potential via third and fourth switching elements, respectively.

4. The semiconductor nonvolatile storage circuit according to claim 3,
    wherein the third and fourth switching elements are fifth and sixth MISFETs, and
    wherein gate terminals of the fifth and sixth MISFETs connect to a differential pair line of the second word line.

5. The semiconductor nonvolatile storage circuit according to claim 2, further comprising:
    a volatile storage circuit whose one storage node connects to the bit line and the other storage node connects to the differential pair line of the bit line,
    wherein a drain terminal of the third MISFET connects to the one storage node of the volatile storage circuit,
    wherein a drain terminal of the fourth MISFET connects to the other storage node of the volatile storage circuit,
    wherein the one storage node and the other storage node of the volatile storage circuit connect to each other via a fifth switching element, and
    wherein a ground line of the volatile storage circuit connects to the ground potential via a sixth switching element.

6. The semiconductor nonvolatile storage circuit according to claim 2,
    wherein the drain terminals of the first and second MISFETs connect to the ground potential via third and fourth switching elements, respectively.

7. The semiconductor nonvolatile storage circuit according to claim 6,
    wherein the third and fourth switching elements are fifth and sixth MISFETs, and
    wherein gate terminals of the fifth and sixth MISFETs connect to a differential pair line of the second word line.

8. The semiconductor nonvolatile storage circuit according to claim 3, further comprising:
    a volatile storage circuit whose one storage node connects to the bit line and the other storage node connects to the differential pair line of the bit line,
    wherein a drain terminal of the third MISFET connects to the one storage node of the volatile storage circuit,
    wherein a drain terminal of the fourth MISFET connects to the other storage node of the volatile storage circuit, wherein the one storage node and the other storage node of the volatile storage circuit connect to each other via a fifth switching element, and wherein a ground line of the volatile storage circuit connects to the ground potential via a sixth switching element.

9. The semiconductor nonvolatile storage circuit according to claim 6, further comprising:

a volatile storage circuit whose one storage node connects to the bit line and the other storage node connects to the differential pair line of the bit line, wherein a drain terminal of the third MISFET connects to the one storage node of the volatile storage circuit, wherein a drain terminal of the fourth MISFET connects to the other storage node of the volatile storage circuit, wherein the one storage node and the other storage node of the volatile storage circuit connect to each other via a fifth switching element, and wherein a ground line of the volatile storage circuit connects to the ground potential via a sixth switching element.

10. The semiconductor nonvolatile storage circuit according to claim 4, further comprising:

a volatile storage circuit whose one storage node connects to the bit line and the other storage node connects to the differential pair line of the bit line, wherein a drain terminal of the third MISFET connects to the one storage node of the volatile storage circuit, wherein a drain terminal of the fourth MISFET connects to the other storage node of the volatile storage circuit, wherein the one storage node and the other storage node of the volatile storage circuit connect to each other via a fifth switching element, and wherein a ground line of the volatile storage circuit connects to the ground potential via a sixth switching element.

11. The semiconductor nonvolatile storage circuit according to claim 7, further comprising:

a volatile storage circuit whose one storage node connects to the bit line and the other storage node connects to the differential pair line of the bit line, wherein a drain terminal of the third MISFET connects to the one storage node of the volatile storage circuit, wherein a drain terminal of the fourth MISFET connects to the other storage node of the volatile storage circuit, wherein the one storage node and the other storage node of the volatile storage circuit connect to each other via a fifth switching element, and wherein a ground line of the volatile storage circuit connects to the ground potential via a sixth switching element.

* * * * *